(12) United States Patent
Kurihara (10) Patent No.: US 10,853,164 B2
(45) Date of Patent: Dec. 1, 2020

(54) DISPLAY AND DISPLAY SYSTEM (71) Applicant: Japan Display Inc., Tokyo (JP)

(72) Inventor: Hiroshi Kurihara, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/259,402

(22) Filed: Jan. 28, 2019

(65) Prior Publication Data

US 2019/0235950 A1    Aug. 1, 2019

(30) Foreign Application Priority Data

Jan. 30, 2018 (JP) ................... 2018-013336

(51) Int. Cl.
*G06F 11/10* (2006.01)
*H03M 13/09* (2006.01)
*G09G 3/36* (2006.01)
*H03M 13/00* (2006.01)

(52) U.S. Cl.
CPC ....... *G06F 11/1004* (2013.01); *G09G 3/3648* (2013.01); *G09G 3/3677* (2013.01); *H03M 13/09* (2013.01); *H03M 13/091* (2013.01); *H03M 13/6561* (2013.01); *G09G 2330/12* (2013.01)

(58) Field of Classification Search
CPC .............................................. G06F 11/1004
USPC ................................. 714/758, 762, 753, 759
See application file for complete search history.

(56) References Cited

U.S. PATENT DOCUMENTS

| | | | | |
|---|---|---|---|---|
| 5,987,624 A * | 11/1999 | Eglit | ................ | G09G 5/006 345/690 |
| 5,990,852 A * | 11/1999 | Szamrej | ............... | H04N 19/507 345/2.1 |
| 6,006,354 A * | 12/1999 | McGuinness | .......... | G06F 11/10 463/1 |
| 9,990,248 B2 * | 6/2018 | Woo | ................ | G06F 11/1004 |
| 2008/0091931 A1 * | 4/2008 | McNutt | ................ | G05B 19/054 713/1 |
| 2012/0036418 A1 * | 2/2012 | Morino | ............... | G06F 11/1004 714/807 |
| 2015/0154943 A1 * | 6/2015 | Lee | .......................... | G09G 5/18 345/204 |

FOREIGN PATENT DOCUMENTS

JP    2016-218781 A    12/2016

* cited by examiner

*Primary Examiner* — Fritz Alphonse
(74) *Attorney, Agent, or Firm* — K&L Gates LLP (57) ABSTRACT

A display configured to detect an error in display data without a parallel-serial conversion circuit is provided. The display includes a display area, a control unit, and a plurality of first CRC circuits. The control unit receives whole display data to control the display area. The whole display data includes a plurality of unit display data and a plurality of CRC data. The plurality of unit display data are each composed of a predetermined count of bits. A count of the plurality of CRC data is identical to the predetermined count of bits. The plurality of first CRC circuits correspond to the respective plurality of CRC data.

14 Claims, 9 Drawing Sheets

DISPLAY AND DISPLAY SYSTEM

CLAIM OF PRIORITY

The present application claims priority from Japanese Patent Application JP 2018-13336 filed on Jan. 30, 2018, the content of which is hereby incorporated by reference into this application.

BACKGROUND

The present invention relates to a display, and is especially applicable to a display and a display system that have a function to detect errors in display data.

There has been proposed a technique to generate Cyclic Redundancy Check (CRC) data to detect a data error that has occurred on a transmission path (see JP-A-2016-218781).

When CRC data is generated for a plurality of pieces of parallel data, the parallel data is converted into serial data to be input to a CRC generation circuit. The CRC generation circuit uses a CRC generator polynomial to divide the input serial data, and generates a remainder obtained by the division as CRC data. The generated CRC data is attached to ends of the plurality of pieces of parallel data, and transmitted to, for example, a transmission path. An error detection unit converts the plurality of pieces of parallel data transmitted via the transmission path into serial data to calculate CRC data through a method same as that of the CRC generation circuit. The error detection unit compares the calculated CRC data with the attached CRC data, and determines that an error has occurred when both CRC data do not match.

Thus, the generation of the CRC data to the plurality of pieces of parallel data requires a parallel-serial conversion circuit that converts the parallel data into serial data, and requires a high-speed clock and high-speed dividing processing. However, the high-speed dividing processing has a limitation. When a bit error, for example, caused by divisibility with the CRC generator polynomial occurs, abnormality possibly fails to be detected.

It is an object of the present invention to provide a display and a display system configured to detect an error in display data without a parallel-serial conversion circuit.

Other objects and novel features will become clear by descriptions and attached drawings in this Description.

SUMMARY

An outline of a representative embodiment of the present invention is briefly described as follows.

That is, the display includes a display area, a control unit, and a plurality of first CRC circuits. The control unit receives whole display data to control the display area. The whole display data includes a plurality of unit display data and a plurality of CRC data. The plurality of unit display data are each composed of a predetermined count of bits. A count of the plurality of CRC data is identical to the predetermined count of bits. The plurality of first CRC circuits correspond to the respective plurality of CRC data.

2

DESCRIPTION OF THE PREFERRED EMBODIMENTS

The following describes embodiments of the present invention with reference to the drawings.

It should be noted that the disclosure is merely an example, and, various alternative examples that those skilled in the art would be able to easily achieve without departing from the gist of the present invention are obviously included in a technical range of the present invention. For clearer descriptions, the drawings are schematically illustrated in width, thickness, shape, and similar factor of each unit compared with those of actual aspects in some cases. However, they are merely one example, and not intended to limit interpretations of the present invention.

In the present description and the respective drawings, components similar to those described previously with reference to earlier figures are labeled with like reference numerals, and the detailed description thereof is omitted appropriately.

This embodiment discloses a liquid crystal display mounted to a vehicle as an exemplary display. This liquid crystal display can be used for various kinds of devices such as a smart phone, a tablet terminal, a mobile phone terminal, a personal computer, a television receiver, and a game machine. A main configuration disclosed in this embodiment is applicable to a self-luminous display that includes, for example, an organic electroluminescence display panel, maicro LED (uLED) display panel, an electronic paper display that includes, for example, an electrophoretic element, a display to which Micro Electro Mechanical Systems (MEMS) are applied, a display to which electrochromism is applied, or similar display.

Embodiments

Figure 1:
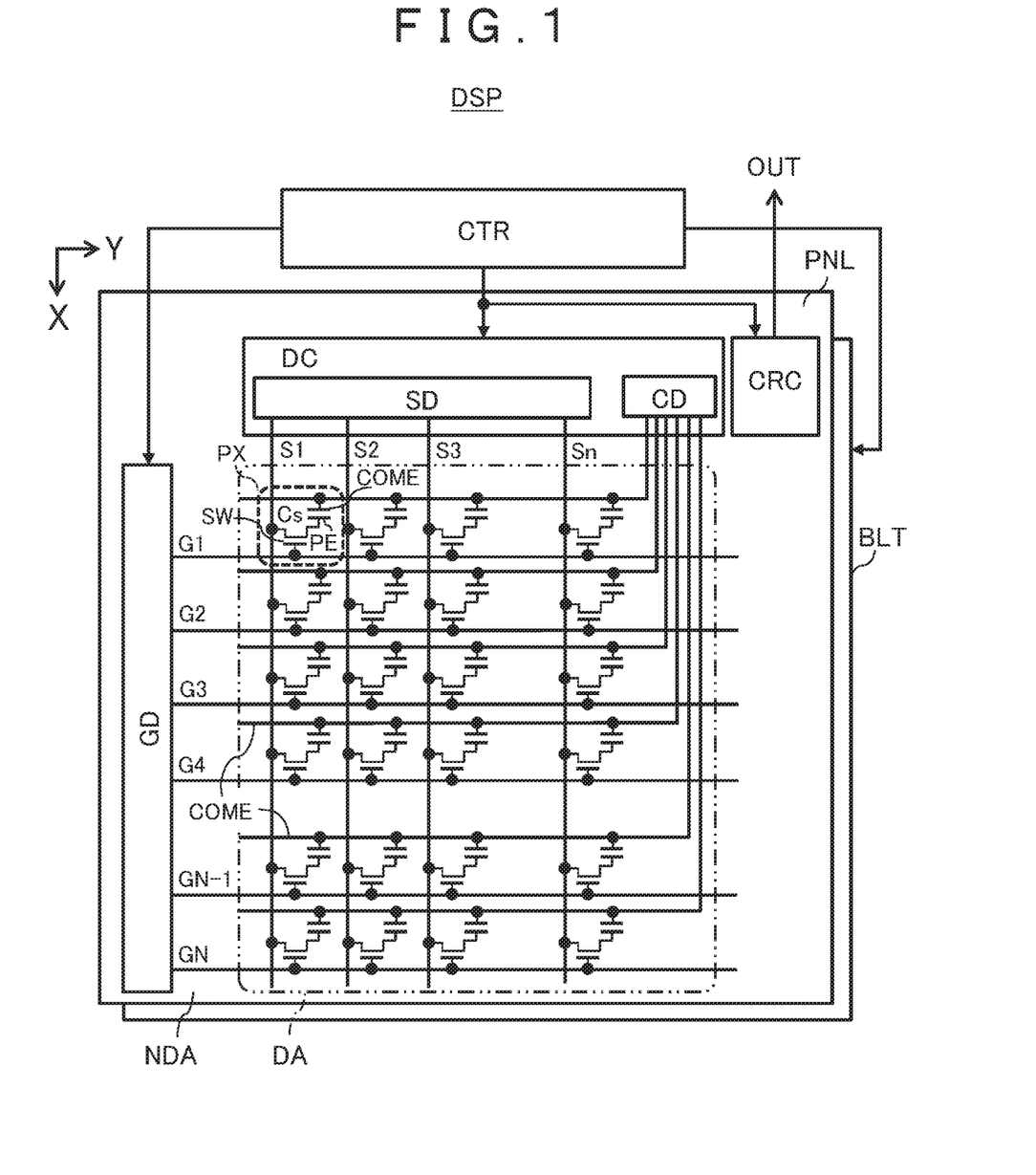
FIG. 1 is a drawing illustrating a schematic configuration of a display DSP according to an embodiment.

FIG. 1 is a drawing illustrating a schematic configuration of a display DSP according to the embodiment. In the embodiment, the display is a liquid crystal display.

The display DSP includes a display panel PNL and a backlight BLT that illuminates the display panel PNL from a back side. The display panel PNL includes a display unit (or a display area) DA including display pixels PX disposed in a matrix.

As illustrated in FIG. 1, the display area DA includes gate lines G (G1, G2, . . . , GN-1, GN) extending along rows where a plurality of display pixels PX are arranged, source lines S (S1, S2, . . . , Sn) extending along columns where a plurality of display pixels PX are arranged, and pixel switches SW disposed proximities of positions where the gate lines (scanning lines) G intersect with the source lines (signal lines) S. The plurality of display pixels PX each include a pixel electrode PE and a common electrode COME, and each have a liquid crystal layer between the opposing pixel electrode PE and common electrode COME. A plurality of common electrodes COME extended in a row direction (Y) are arranged in a column direction (X). A configuration where the plurality of common electrodes COME extended in the column direction (X) are arranged in the row direction (Y) may be employed.

The pixel switch SW includes a Thin Film Transistor (TFT). The pixel switch SW has a gate electrode electrically connected to a corresponding gate line G. The pixel switch SW has a source electrode electrically connected to a corresponding source line S. The pixel switch SW has a drain electrode electrically connected to a corresponding pixel electrode PE.

As driving means to drive the plurality of display pixels PX, a gate driver (gate driving circuit) GD, a source driver (source driving circuit) SD, and a common electrode driving circuit CD are disposed. A plurality of gate lines G are each electrically connected to an output circuit of the gate driver GD. A plurality of source lines S are each electrically connected to an output circuit of the source driver SD. The common electrodes COME are electrically connected to an output circuit of the common electrode driving circuit CD. In FIG. 1, the source driver SD and the common electrode driving circuit CD are illustrated so as to be disposed in the driving circuit DC. The gate driver GD, the source driver SD, and the common electrode driving circuit CD are arranged on a peripheral region (frame region) NDA at a periphery of the display area DA or a flexible substrate connected to the display panel PNL. The gate driver GD sequentially applies on-voltage to the plurality of gate lines G to supply the on-voltage to the gate electrode of the pixel switch SW electrically connected to a selected gate line G. At the pixel switch SW where the on-voltage has been supplied to the gate electrode, electricity is conducted between the source electrode and the drain electrode. The source driver SD supplies output signals corresponding to the respective plurality of source lines S. The signal supplied to the source line S is supplied to the corresponding pixel electrode PE via the pixel switch SW where the electricity is conducted between the source electrode and the drain electrode.

As detection means to detect abnormality and errors in display data, which would occur on the transmission path, an error detection circuit CRC is disposed. While the error detection circuit CRC is illustrated so as to be arranged on the peripheral region (frame region) NDA at the periphery of the display area DA in this example, the error detection circuit CRC may be arranged on the flexible substrate connected to the display panel PNL.

The error detection circuit CRC receives the display data and CRC data attached to the display data, and calculates CRC data to the display data, thus comparing the calculated CRC data with the attached CRC data. When both CRC data match, the error detection unit CRC determines that the error has not occurred. Meanwhile, when both CRC data do not match, the error detection circuit CRC determines that the error has occurred. When both CRC data do not match, the error detection circuit CRC outputs an output signal OUT that indicates the detection of the error to, for example, a host device HOST described below.

A control circuit CTR disposed outside or inside the display panel PNL controls behaviors of the gate driver GD, the source driver SD, and the common electrode driving circuit CD. That is, the control circuit CTR receives the display data and the CRC data attached to the display data from the host device HOST described below, and controls the gate driver GD, the source driver SD, and the common electrode driving circuit CD, thus controlling the behavior of the display DSP. Accordingly, the gate driver GD, the source driver SD, the common electrode driving circuit CD, and the control circuit CTR can be also regarded as a control unit that controls the display area DA. The control circuit CTR controls the behavior of the backlight BLT. The control circuit CTR supplies the display data and the CRC data attached to the display data, which are transmitted from the host device HOST described below, to the error detection circuit CRC.

While FIG. 1 illustrates the error detection unit CRC so as to be disposed inside the display panel PNL, the configuration is not limited to this. The error detection circuit CRC may be disposed inside the control circuit CTR.

The display data and the CRC data attached to the display data will be described later in detail.

Figure 2:
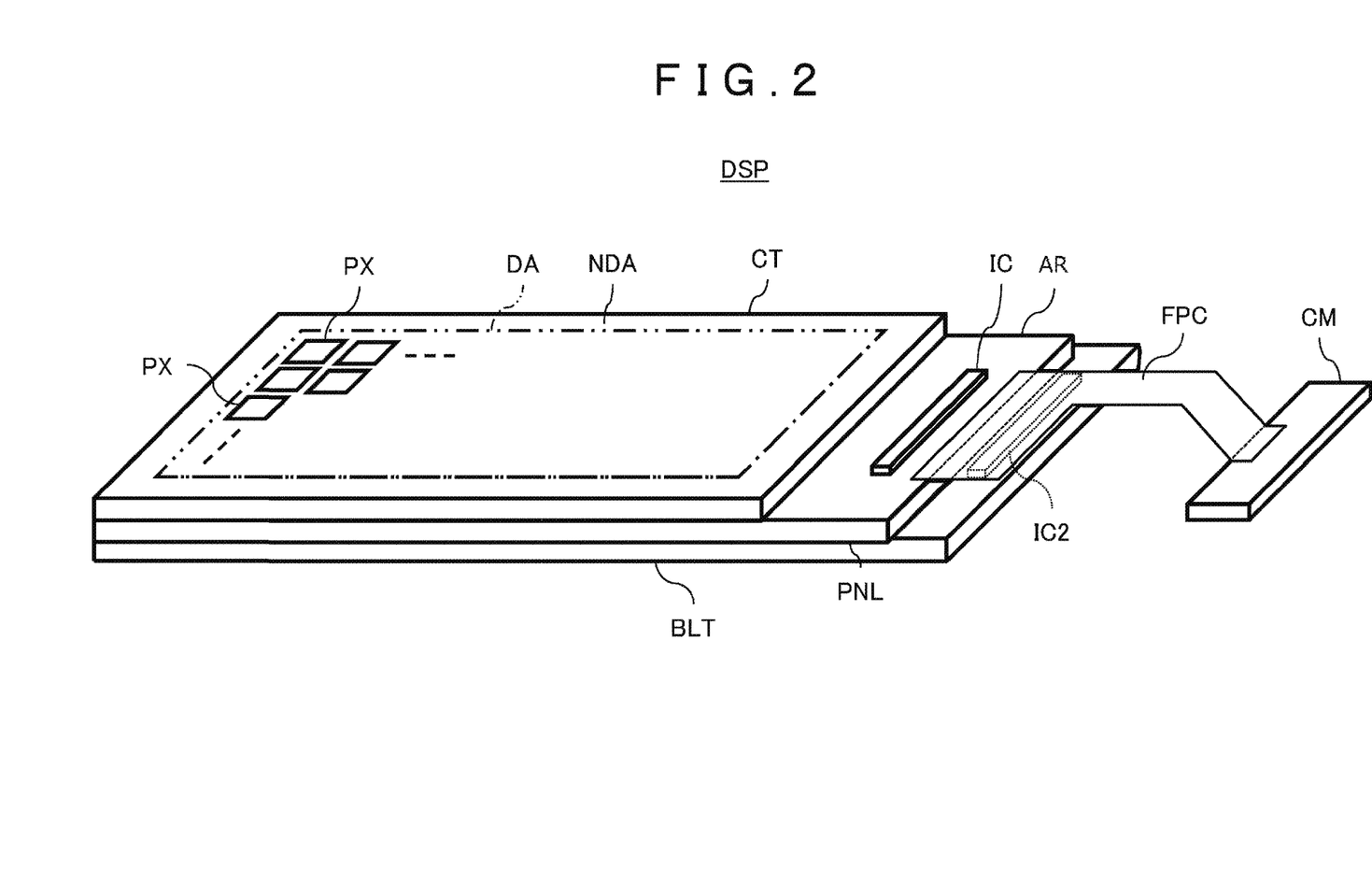
FIG. 2 is a perspective view schematically illustrating a configuration of a liquid crystal display DSP according to the embodiment.

FIG. 2 is a perspective view schematically illustrating a configuration of the liquid crystal display DSP according to the embodiment.

The liquid crystal display DSP includes an active matrix type liquid crystal display panel PNL, a driving IC chip IC that drives the liquid crystal display panel PNL, a control module CM, a flexible wiring board FPC, and similar component.

The liquid crystal display panel PNL includes an array substrate (first substrate) AR and a counter substrate (second substrate) CT disposed opposing the array substrate AR. The liquid crystal display panel PNL includes a display area DA that displays images, and a frame-shaped non-display area NDA surrounding the display area DA. The liquid crystal display panel PNL includes the plurality of display pixels (or unit display pixels) PX arranged in a matrix in the display area DA. The driving IC chip IC is mounted on the array substrate AR. The flexible wiring board FPC connects the liquid crystal display panel PNL to the control module CM. The driving IC chip IC may be disposed on the flexible wiring board FPC as illustrated as an IC2 in FIG. 2. The control module CM is connected to the backlight BLT via another flexible wiring board (not illustrated).

The driving IC chip IC can be regarded as a display driver IC, and the control module CM may include a timing control device TCON. The control circuit CTR in FIG. 1 can be regarded as the display driver IC or the timing control device TCON, or can be regarded as the display driver IC and the timing control device TCON. The error detection circuit CRC in FIG. 1 can be also disposed inside the driving IC chip IC or inside the control module CM.

The control module CM can be also configured as the host device HOST. In this case, the driving IC chip IC can be corresponded to the control circuit CTR in FIG. 1. In this case, for example, the error detection circuit CRC in FIG. 1 can be included in the control circuit CTR while being not specifically limited.

Figure 3:
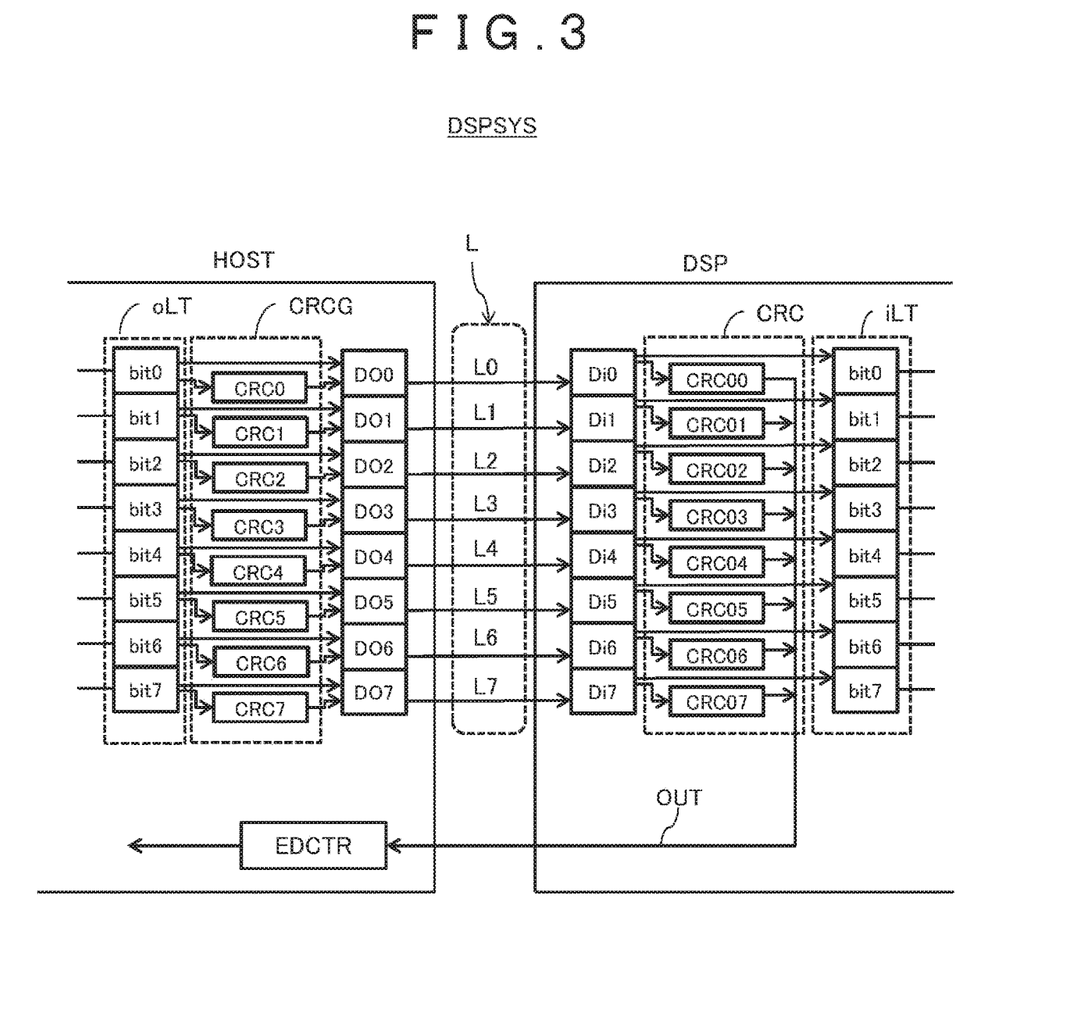
FIG. 3 is a block diagram conceptually illustrating an exemplary configuration of a main part of a display system according to the embodiment.

FIG. 3 is a block diagram conceptually illustrating an exemplary configuration of a main part of a display system according to the embodiment. A display system DSPSYS includes the display DSP and the host device HOST. FIG. 3 illustrates an exemplary configuration of an output circuit of the host device HOST and an exemplary configuration of an input circuit of the display DSP. The exemplary configuration of the input circuit of the display DSP can be regarded as an input circuit of the control module CM (timing control device TCON) in FIG. 2. Alternatively, when the control module CM in FIG. 2 is configured as the host device HOST, the exemplary configuration of the input circuit of the display DSP can be regarded as an input circuit of the driving IC chip IC.

The output circuit of the host device HOST includes, for example, an output latch circuit oLT configured to latch unit display data of eight bits, a CRC generation circuit group CRCG that generates the CRC data of the display data, and eight output terminals DO0 to DO7. Inputs of the output latch circuit oLT are electrically connected to display data DDATA that includes a plurality of unit display data (Data0 to Data799) as described below with FIG. 4, FIG. 5, and FIG. 6. The plurality of unit display data (Data0 to Data799) are each assumed to include eight bits while being not specifically limited. The output latch circuit oLT includes eight output latch circuits (bit0 to bit7) configured to latch the respective eight bits of the unit display data, and the eight output latch circuits (bit0 to bit7) are electrically connected to eight output terminals DO0 to DO7, respectively. The eight output terminals DO0 to DO7 are electrically connected to wirings L0 to L7 as a transmission path L, respectively. The transmission path L can be corresponded to a plurality of signal wirings disposed on a printed wiring board, a plurality of signal wirings disposed on a flexible wiring board (FPC), or similar signal wiring.

Inputs of the CRC generation circuit group CRCG are electrically connected to the outputs of the respective eight output latch circuits (bit0 to bit7), and the outputs of the CRC generation circuit group CRCG are electrically connected to the respective eight output terminals DO0 to DO7. The CRC generation circuit group CRCG includes eight CRC generation circuits (CRC0 to CRC7) as a plurality of second CRC circuits.

An input of the CRC generation circuit CRC0 is electrically connected to the output latch circuit bit0, and an output of the CRC generation circuit CRC0 is electrically connected to the output terminal DO0. The CRC generation circuit CRC0 generates CRC data (CRCD10) that corresponds to bit0 among the eight bits of the display data to supply to the output terminal DO0.

An input of the CRC generation circuit CRC1 is electrically connected to the output latch circuit bit1, and an output of the CRC generation circuit CRC1 is electrically connected to the output terminal DO1. The CRC generation circuit CRC1 generates CRC data (CRCD11) that corresponds to bit1 among the eight bits of the display data to supply to the output terminal DO1.

An input of the CRC generation circuit CRC2 is electrically connected to the output latch circuit bit2, and an output of the CRC generation circuit CRC2 is electrically connected to the output terminal DO2. The CRC generation circuit CRC2 generates CRC data (CRCD12) that corresponds to bit2 among the eight bits of the display data to supply to the output terminal DO2.

An input of the CRC generation circuit CRC3 is electrically connected to the output latch circuit bit3, and an output of the CRC generation circuit CRC3 is electrically connected to the output terminal DO3. The CRC generation circuit CRC3 generates CRC data (CRCD13) that corresponds to bit3 among the eight bits of the display data to supply to the output terminal DO3.

An input of the CRC generation circuit CRC4 is electrically connected to the output latch circuit bit4, and an output of the CRC generation circuit CRC4 is electrically connected to the output terminal DO4. The CRC generation circuit CRC4 generates CRC data (CRCD14) that corresponds to bit4 among the eight bits of the display data to supply to the output terminal DO4.

An input of the CRC generation circuit CRC5 is electrically connected to the output latch circuit bit5, and an output of the CRC generation circuit CRC5 is electrically connected to the output terminal DO5. The CRC generation circuit CRC5 generates CRC data (CRCD15) that corresponds to bit5 among the eight bits of the display data to supply to the output terminal DO5.

An input of the CRC generation circuit CRC6 is electrically connected to the output latch circuit bit6, and an output of the CRC generation circuit CRC6 is electrically connected to the output terminal DO6. The CRC generation circuit CRC6 generates CRC data (CRCD16) that corresponds to bit6 among the eight bits of the display data to supply to the output terminal DO6.

An input of the CRC generation circuit CRC7 is electrically connected to the output latch circuit bit7, and an output of the CRC generation circuit CRC7 is electrically connected to the output terminal DO7. The CRC generation circuit CRC7 generates CRC data (CRCD17) that corresponds to bit7 among the eight bits of the display data to supply to the output terminal DO7.

The input circuit of the display DSP includes, for example, eight input terminals Di0 to Di7, the error detection circuit CRC, and an input latch circuit iLT. The eight input terminals Di0 to Di7 are electrically connected to the eight output terminals DO0 to DO7, respectively, via the wirings L0 to L7. The input latch circuit iLT is configured to latch the eight bits of the unit display data. The input latch circuit iLT includes eight latch circuits (bit0 to bit7) configured to latch the respective eight bits of the unit display data, and the eight latch circuits (bit0 to bit7) are electrically connected to the eight input terminals Di0 to Di7, respectively.

Inputs of the error detection circuit CRC are electrically connected to the respective input terminals Di0 to Di7. The error detection circuit CRC includes eight error detection circuits (CRC00 to CRC07) as a plurality of first CRC circuits.

The input of the error detection circuit CRC00 is electrically connected to the input terminal Di0, and generates CRC data (CRCD20) corresponding to the bit0 supplied via the wiring L0 among the eight bits of the display data. In addition, the error detection circuit CRC00 receives the CRC data (CRCD10) generated by the CRC generation circuit CRC0, and compares the CRC data (CRCD20) with the CRC data (CRCD10). Then, when both CRC data (CRCD20 and CRCD10) do not match, the error detection circuit CRC00 outputs the output signal OUT indicating the detection of the error.

The input of the error detection circuit CRC01 is electrically connected to the input terminal Di1, and generates CRC data (CRCD21) corresponding to the bit1 supplied via the wiring L1 among the eight bits of the display data. In addition, the error detection circuit CRC01 receives the CRC data (CRCD11) generated by the CRC generation circuit CRC1, and compares the CRC data (CRCD21) with the CRC data (CRCD11). Then, when both CRC data (CRCD21 and CRCD11) do not match, the error detection circuit CRC01 outputs the output signal OUT indicating the detection of the error.

The input of the error detection circuit CRC02 is electrically connected to the input terminal Di2, and generates CRC data (CRCD22) corresponding to the bit2 supplied via the wiring L2 among the eight bits of the display data. In addition, the error detection circuit CRC02 receives the CRC data (CRCD12) generated by the CRC generation circuit CRC2, and compares the CRC data (CRCD22) with the CRC data (CRCD12). Then, when both CRC data (CRCD22 and CRCD12) do not match, the error detection circuit CRC02 outputs the output signal OUT indicating the detection of the error.

The input of the error detection circuit CRC03 is electrically connected to the input terminal Di3, and generates CRC data (CRCD23) corresponding to the bit3 supplied via the wiring L3 among the eight bits of the display data. In addition, the error detection circuit CRC03 receives the CRC data (CRCD13) generated by the CRC generation circuit CRC3, and compares the CRC data (CRCD23) with the CRC data (CRCD13). Then, when both CRC data (CRCD23 and CRCD13) do not match, the error detection circuit CRC03 outputs the output signal OUT indicating the detection of the error.

The input of the error detection circuit CRC04 is electrically connected to the input terminal Di4, and generates CRC data (CRCD24) corresponding to the bit4 supplied via the wiring L4 among the eight bits of the display data. In addition, the error detection circuit CRC04 receives the CRC data (CRCD14) generated by the CRC generation circuit CRC4, and compares the CRC data (CRCD24) with the CRC data (CRCD14). Then, when both CRC data (CRCD24 and CRCD14) do not match, the error detection circuit CRC04 outputs the output signal OUT indicating the detection of the error.

The input of the error detection circuit CRC05 is electrically connected to the input terminal Di5, and generates CRC data (CRCD25) corresponding to the bit5 supplied via the wiring L5 among the eight bits of the display data. In addition, the error detection circuit CRC05 receives the CRC data (CRCD15) generated by the CRC generation circuit CRC5, and compares the CRC data (CRCD25) with the CRC data (CRCD15). Then, when both CRC data (CRCD25 and CRCD15) do not match, the error detection circuit CRC05 outputs the output signal OUT indicating the detection of the error.

The input of the error detection circuit CRC06 is electrically connected to the input terminal Di6, and generates CRC data (CRCD26) corresponding to the bit6 supplied via the wiring L6 among the eight bits of the display data. In addition, the error detection circuit CRC06 receives the CRC data (CRCD16) generated by the CRC generation circuit CRC6, and compares the CRC data (CRCD26) with the CRC data (CRCD16). Then, when both CRC data (CRCD26 and CRCD16) do not match, the error detection circuit CRC06 outputs the output signal OUT indicating the detection of the error.

The input of the error detection circuit CRC07 is electrically connected to the input terminal Di7, and generates CRC data (CRCD27) corresponding to the bit7 supplied via the wiring L7 among the eight bits of the display data. In addition, the error detection circuit CRC07 receives the CRC data (CRCD17) generated by the CRC generation circuit CRC7, and compares the CRC data (CRCD27) with the CRC data (CRCD17). Then, when both CRC data (CRCD27 and CRCD17) do not match, the error detection circuit CRC07 outputs the output signal OUT indicating the detection of the error.

The output signal OUT indicating the detection of the error is transmitted to an error detection control circuit EDCTR configured in the host device HOST from the display DSP. The error detection control circuit EDCTR gives a processor in the host device HOST, for example, a request for retransmission of the display data or an instruction to deal with a failure.

Figure 6:
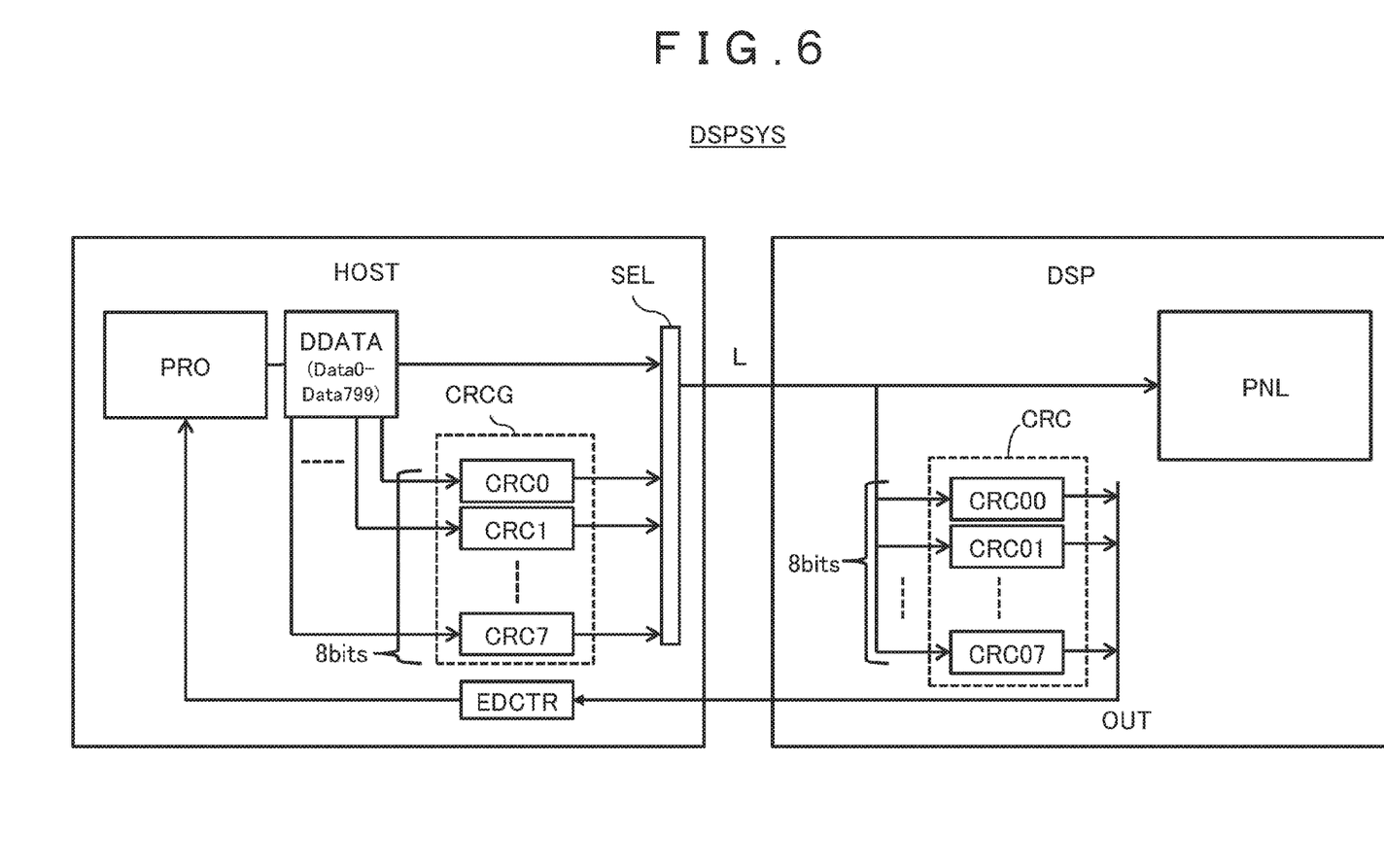
FIG. 6 is a block diagram conceptually illustrating the entire display system according to the embodiment.

While FIG. 3 exemplarily illustrates the output latch circuit oLT, the output latch circuit oLT may be omitted. As illustrated in FIG. 6 described below, it is only necessary that the display data DDATA including the plurality of unit display data (Data0 to Data799) is sequentially supplied to the CRC generation circuits CRC0 to CRC7 and the output terminals DO0 to DO7. While FIG. 3 exemplarily illustrates the input latch circuit iLT, the input latch circuit iLT may be omitted.

Figure 4:
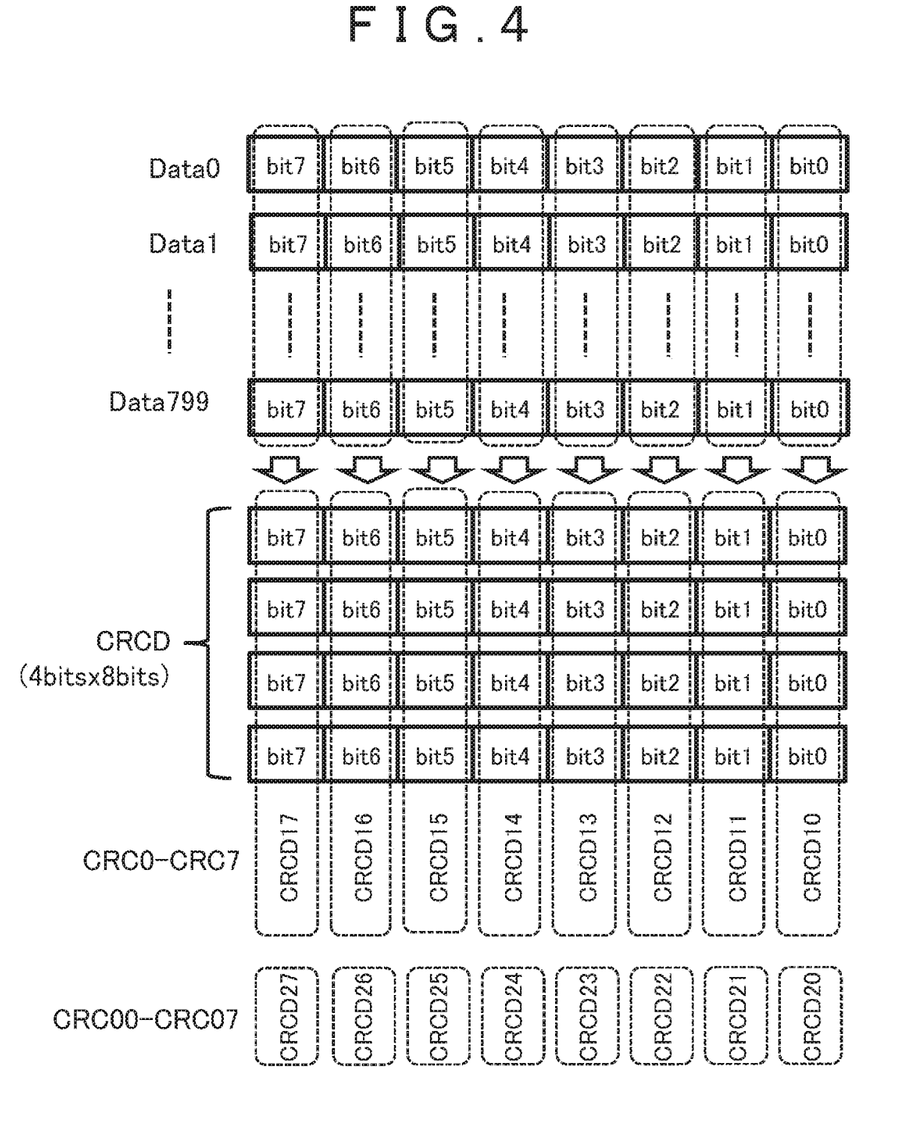
FIG. 4 is a drawing describing a relationship between display data and CRC data according to the embodiment.

FIG. 4 is a drawing describing a relationship between the display data and the CRC data according to the embodiment. FIG. 4 illustrates the generation of the CRC data (CRCD10 to CRCD17) in the CRC generation circuit group CRCG (CRC0 to CRC7) in the output circuit of the host device HOST illustrated in FIG. 3, and the generation of the CRC data (CRCD20 to CRCD27) in the error detection circuit CRC (CRC00 to CRC07) in the input circuit of the display DSP. In FIG. 4, the CRC data (CRCD10 to CRCD17) indicate CRC codes generated by the CRC generation circuit group CRCG (CRC0 to CRC7). The CRC data (CRCD20 to CRCD27) indicate CRC codes generated by the error detection circuit CRC (CRC00 to CRC07). As a generator polynomial of the CRC data, that of around four bits to 64 bits has been known. However, FIG. 4 exemplarily illustrates a case where $X^4+X+1$ is used as the generator polynomial of the CRC data employed in the CRC generation circuit group CRCG (CRC0 to CRC7) and the error detection circuit CRC (CRC00 to CRC07). In the case where $X^4+X+1$ is used as the generator polynomial of the CRC data, the CRC data is composed of four bits.

The display data includes, for example, the unit display data 0 (Data0) to the unit display data 799 (Data799), and the plurality of unit display data (Data0 to Data799) are each assumed to be composed of a predetermined number of bits such as eight bits (bit0 to bit7). It is assumed that the unit display data 0 (Data0) to the unit display data 799 (Data799) are sequentially output from the output terminals DO0 to DO7 via the output latch circuit oLT constituting the output circuit of the host device HOST, and supplied to the input circuit of the display DSP via the wirings L0 to L7.

In the CRC generation circuit group CRCG in the output circuit of the host device HOST illustrated in FIG. 3, the CRC generation circuit CRC0 sequentially receives and adds the respective data of bit0 of the plurality of unit display data (Data0 to Data799), and divides the addition result using a predetermined CRC generator polynomial. Then, the CRC generation circuit CRC0 generates a remainder obtained by the division as the CRC data CRCD10 of four bits corresponding to the bit0. The CRC generation circuit CRC1 sequentially receives and adds the respective data of bit1 of the plurality of unit display data (Data0 to Data799), and divides the addition result using the predetermined CRC generator polynomial. Then, the CRC generation circuit CRC1 generates a remainder obtained by the division as the CRC data CRCD11 of four bits corresponding to the bit1. The CRC generation circuit CRC2 sequentially receives and adds the respective data of bit2 of the plurality of unit display data (Data0 to Data799), and divides the addition result using the predetermined CRC generator polynomial. Then, the CRC generation circuit CRC2 generates a remainder obtained by the division as the CRC data CRCD12 of four bits corresponding to the bit2. Similarly, the CRC generation circuit CRC3 (CRC4, CRC5, CRC6, and CRC7) generates the CRC data CRCD13 of four bits corresponding to the bit3 (CRC data CRCD14 of four bits corresponding to the bit4, CRC data CRCD15 of four bits corresponding to the bit5, CRC data CRCD16 of four bits corresponding to the bit6, and CRC data CRCD17 of four bits corresponding to the bit7) from the respective bit3 (bit4, bit5, bit6, and bit7) of the plurality of unit display data (Data0 to Data799).

The generated CRC data CRCD10 is attached to the end of the bit0 of the unit display data Data799, output from the output terminal DO0, and supplied to the input circuit of the display DSP via the wiring L0. Similarly, the generated CRC data CRCD11 (CRCD12 to CRCD17) is attached to the end of the bit1 (bit2 to bit7) of the unit display data Data799, output from the output terminal DO1 (DO2 to DO7), and supplied to the input circuit of the display DSP via the wiring L1 (L2 to L7). That is, the display DSP receives whole display data from the host device HOST via the wiring L1 (L2 to L7). The whole display data includes the plurality of unit display data (Data0 to Data799) each composed of a predetermined number of bits (eight bits) and a plurality of CRC data (CRCD10 to CRCD17) the number of which is identical to the predetermined number of bits.

As illustrated in FIG. 3, the error detection circuits CRC00 to CRC07 are disposed corresponding to the plurality of CRC data (CRCD10 to CRCD17), respectively.

As described with FIG. 4, the error detection circuits CRC00 to CRC07 are each configured to sequentially receive a predetermined bit (corresponding one bit among the bit0 to the bit7) among the bit0 to the bit7 of the plurality of unit display data (Data0 to Data799) and generate the CRC data (CRCD20 to CRCD27) each composed of four bits. The CRC data (CRCD20 to CRCD27) generated by the error detection circuits CRC00 to CRC07 are compared with CRCD10 to CRCD17 received with the whole display data. When the CRC data (CRCD20 to CRCD27) do not match the received CRCD10 to CRCD17, it is determined that the abnormality and/or the error have occurred on the display data through the transmission path, and the output signal OUT indicating the detection of the error is output.

Thus, CRC calculations are performed on respective bits into which the unit display data (Data0 to Data799) are each divided, and the CRC data (CRCD10 to CRCD17) for respective bits are attached. In addition, the CRC calculations are performed on respective bits into which the unit display data (Data0 to Data799) are each divided, and the CRC data (CRCD20 to CRCD27) for respective bits are generated. That is, the CRC generation circuits CRC0 to CRC7 or the error detection circuits CRC00 to CRC07 are disposed for respective bits, and the CRC calculations are performed in parallel. This eliminates the need for a parallel-serial conversion circuit. Further, this eliminates the need for the calculation of the CRC data using a high-speed clock. The calculation of the CRC data can be performed with a simple CRC generation circuit. Since bit failure errors can be detected for respective bits in parallel, occurrence probability of undetectable data error (error caused by divisibility with the generator polynomial) can be lowered.

While the configuration of FIG. 4 has been described such that the respective CRC generator polynomials in the CRC generation circuits CRC0 to CRC7 are identical to the respective CRC generator polynomials in the error detection circuits CRC00 to CRC07, the configuration is not limited to this. While it is necessary that the CRC generation circuit and the error detection circuit disposed corresponding to the identical bit of the unit display data have the identical CRC generator polynomial, the CRC generator polynomials that differ for respective bits may be employed. That is, for example, the CRC generator polynomial for the CRC generation circuit CRC0 and the error detection circuit CRC00 disposed corresponding to the bit0 may be different from the CRC generator polynomial for the CRC generation circuit CRC1 and the error detection circuit CRC01 disposed corresponding to the bit1. Similarly, the CRC generator polynomial for the CRC generation circuit CRC2 and the error detection circuit CRC02 disposed corresponding to the bit2, and the CRC generator polynomial for the CRC generation circuit CRC3 and the error detection circuit CRC03 disposed corresponding to the bit3 may be different from the CRC generator polynomial for the CRC generation circuit CRC0 and the error detection circuit CRC00 disposed corresponding to the bit0. Thus, the CRC generator polynomials that differ for bits can further lower the occurrence probability of the undetectable data error (error caused by divisibility with the generator polynomial).

Figure 5:
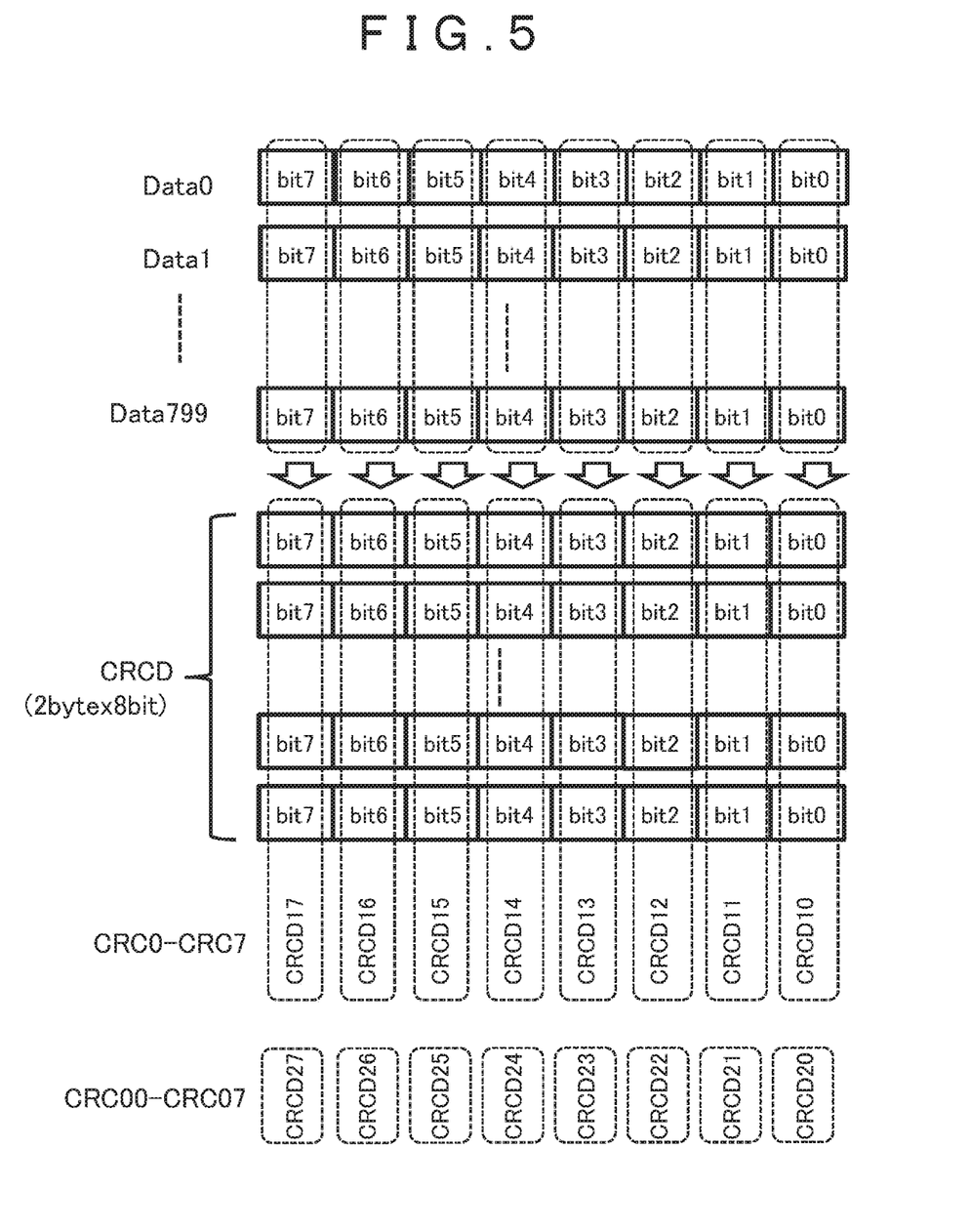
FIG. 5 is a drawing describing another example of the relationship between the display data and the CRC data according to the embodiment.

FIG. 5 is a drawing describing another example of the relationship between the display data and the CRC data according to the embodiment. FIG. 5 is a modification of FIG. 4. FIG. 4 illustrates the case where $X^4+X+1$ is used as the generator polynomial of the CRC data. FIG. 5 exemplarily illustrates a case where $X^{16}+X^{12}+X^5+1$ is used as the generator polynomial of the CRC data employed in the CRC generation circuit group CRCG (CRC0 to CRC7) and the error detection circuit CRC (CRC00 to CRC07). When $X^{16}+X^{12}+X^5+1$ is used as the generator polynomial of the CRC data, the CRC data are each composed of two bytes. Similarly to FIG. 4, the display data includes, for example, the unit display data 0 (Data0) to the unit display data 799 (Data799), and the plurality of unit display data (Data0 to Data799) are each composed of a predetermined number of bits such as eight bits (bit0 to bit7). In FIG. 5, similarly to FIG. 4, the CRC calculations are performed on respective bits into which the unit display data (Data0 to Data799) are each divided, and the CRC data (CRCD10 to CRCD17) for respective bits are generated and attached. In addition, the CRC calculations are performed on respective bits into which the unit display data (Data0 to Data799) are each divided, and the CRC data (CRCD20 to CRCD27) for respective bits are attached. That is, all the CRC data of the CRC data (CRCD10 to CRCD17) and all the CRC data of the CRC data (CRCD20 to CRCD27) are each composed of two bytes×eight bits.

In FIG. 4 or FIG. 5, when the plurality of unit display data (Data0 to Data799) where gradations of pixels are each composed of a predetermined number of bits (eight bits) are assumed to be, for example, the display data of a red R among the display data indicating the red R, a green and a blue B, the CRC generation circuits perform the CRC calculations also on respective bits into which the display data indicating the green G and the display data indicating the blue B are each divided similarly to FIG. 4 or FIG. 5, thus generating and attaching the CRC data for respective bits. In addition, the error detection circuits perform the CRC calculations on respective bits into which the display data indicating the green G and the display data indicating the blue B are each divided, thus generating the CRC data for respective bits.

Figure 7:
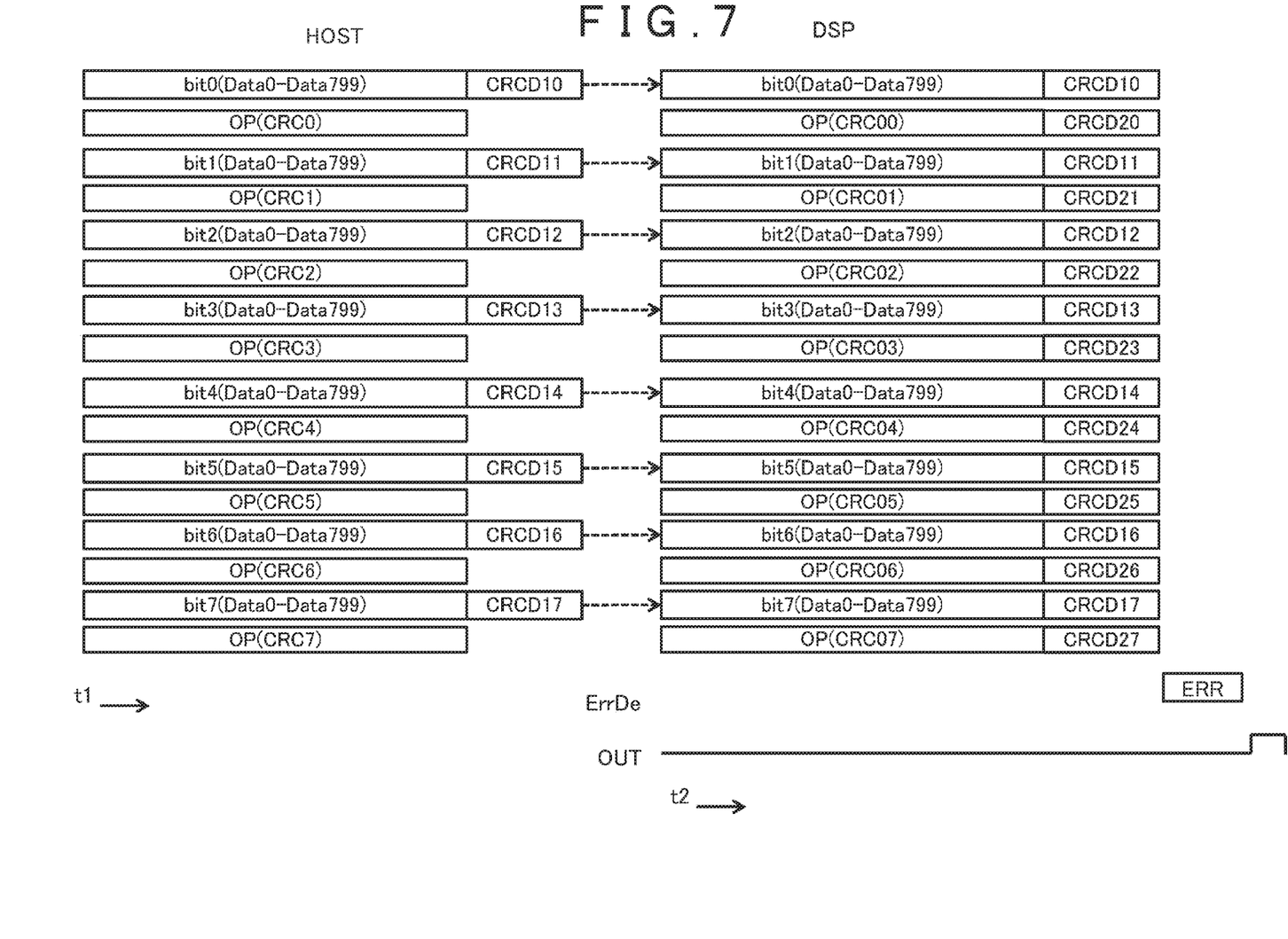
FIG. 7 is a drawing describing a behavior of the display system of FIG. 6.

FIG. 6 is a block diagram conceptually illustrating the entire display system according to the embodiment. FIG. 7 is a drawing describing a behavior of the display system of FIG. 6.

In FIG. 7, a t1 and a t2 indicate directions in which time elapses. As described with FIG. 3, in the display system DSPSY, the host device HOST is connected to the display DSP via the transmission path L including the wirings L0 to L7.

The host device HOST includes, for example, a processor PRO that generates the display data DDATA. The display data DDATA includes the unit display data Data0 to Data799. As described above, the unit display data Data0 to Data799 are each composed of the predetermined number of bits such as eight bits (bit0 to bit7). As described with FIG. 3, the CRC generation circuit unit CRCG includes eight CRC generation circuits CRC0 to CRC7 as a plurality of second CRC circuits disposed corresponding to the bit0 to the bit7 of the respective unit display data Data0 to Data799. The CRC generation circuits CRC0 to CRC7 execute operations in parallel, generate the CRC data (CRCD10 to CRCD17) corresponding to the bit0 to the bit7 of the unit display data Data0 to Data799, and attach the CRC data (CRCD10 to CRCD17) to the ends of the bit0 to the bit7 of the respective unit display data Data799. In FIG. 6, a selection circuit SEL is configured to attach the CRC data (CRCD10 to CRCD17) to the ends of the bit0 to the bit7 of the respective unit display data Data799.

That is, as illustrated in FIG. 7, the CRC generation circuit CRC0 sequentially receives the bit0 of the unit display data Data0 to Data799, executes an operation OP to generate the CRC data CRCD10 corresponding to the bit0 of the unit display data Data0 to Data799, and attaches the CRC data CRCD10 to the end of the bit0 of the unit display data Data799. Similarly to the behavior of the CRC generation circuit CRC0, the CRC generation circuits CRC1 to CRC7 sequentially receive the corresponding bits among the bit1 to the bit7 of the unit display data Data0 to Data799, execute the operations OP to generate the CRC data CRCD11 to CRCD17 for the corresponding bits, and attach the CRC data CRCD11 to CRCD17 to the ends of corresponding bit1 to bit7 of the unit display data Data799. That is, as illustrated in FIG. 7, the respective operations OP in the CRC generation circuits CRC0 to CRC7 are performed in parallel to generate the CRC data CRCD10 to CRCD17.

Meanwhile, the display DSP receives the whole display data that includes the unit display data Data0 to Data799 and the CRC data (CRCD10 to CRCD17) attached to the respective bits of the unit display data Data0 to Data799 via the transmission path L. The display DSP includes the display panel PNL and the error detection unit CRC similarly to the display DSP described with FIG. 1 and FIG. 3. The display panel PNL receives the unit display data Data0 to Data799, and performs display on the display area DA in accordance with the unit display data Data0 to Data799. The error detection unit CRC includes eight error detection circuits CRC00 to CRC07 as a plurality of first CRC circuits disposed corresponding to the respective bits of the unit display data Data0 to Data799. The error detection circuits CRC00 to CRC07 execute operations in parallel, and generate the CRC data (CRCD20 to CRCD27) corresponding to the bit0 to the bit7 of the unit display data Data0 to Data799. Then, the error detection circuits CRC00 to CRC07 compare the generated CRC data (CRCD20 to CRCD27) with the CRC data (CRCD10 to CRCD17) attached to the respective ends of the bit0 to the bit7 of the unit display data Data799.

That is, as illustrated in FIG. 7, the error detection circuit CRC00 sequentially receive the bit0 of the unit display data Data0 to Data799, and executes an operation OP to generate the CRC data CRCD20 corresponding to the bit0 of the unit display data Data0 to Data799. Then, the error detection circuit CRC00 compares the generated CRC data CRCD20 with the CRC data CRCD10 attached to the end of the bit0 of the unit display data Data799 to perform an error determination ErrDe. Similarly to the behavior of the error detection circuit CRC00, the error detection circuits CRC01 to CRC07 sequentially receive the corresponding bits among the bit1 to the bit7 of the unit display data Data0 to Data799, and execute the operations OP to generate the CRC data CRCD21 to CRCD27 for the corresponding bits. Then, the error detection circuits CRC01 to CRC07 compare the generated CRC data CRCD21 to CRCD27 with the CRC data CRCD11 to CRCD17 attached to the ends of the bit1 to the bit7 of the unit display data Data799 to perform the error determinations ErrDe. That is, as illustrated in FIG. 7, the respective operations OP in the error detection circuits CRC00 to CRC07 are performed in parallel to generate the CRC data CRCD20 to CRCD27, and then, the error determinations ErrDe are performed in parallel.

In the error determination ErrDe, when the CRC data (CRCD20 to CRCD27) match the CRC data (CRCD10 to CRCD17), it is determined that the error has not occurred on the display data through the transmission path L. Meanwhile, when the CRC data (CRCD20 to CRCD27) do not match the CRC data (CRCD10 to CRCD17), it is determined that the error (ERR) has occurred on the display data through the transmission path L, and the output signal OUT indicating the detection of the error is output.

The output signal OUT is transmitted to the error detection control circuit EDCTR disposed in the host device HOST, similarly to the output signal OUT described with FIG. 3. The error detection control circuit EDCTR gives the processor PRO in the host device HOST, for example, a request for retransmission of the display data or an instruction to deal with a failure.

When the display data is retransmitted to the display DSP from the host device HOST, CRC generation may be executed only on the display data corresponding to the bit where the error (ERR) has occurred on the display data, and the CRC data is attached to the corresponding display data and transmitted to the display DSP. In this case, the display DSP may be configured to perform the operation of the CRC data only on the display data corresponding to the bit where the error (ERR) has occurred on the display data, and compare the operated CRC data with the CRC data transmitted from the host device HOST to perform the error determination ErrDe.

The data divided into the bits are, for example, sorted in an order appropriate for the display in the driving circuit DC of the display panel PNL, and output to the respective pixels from the source driver SD.

Figure 8:
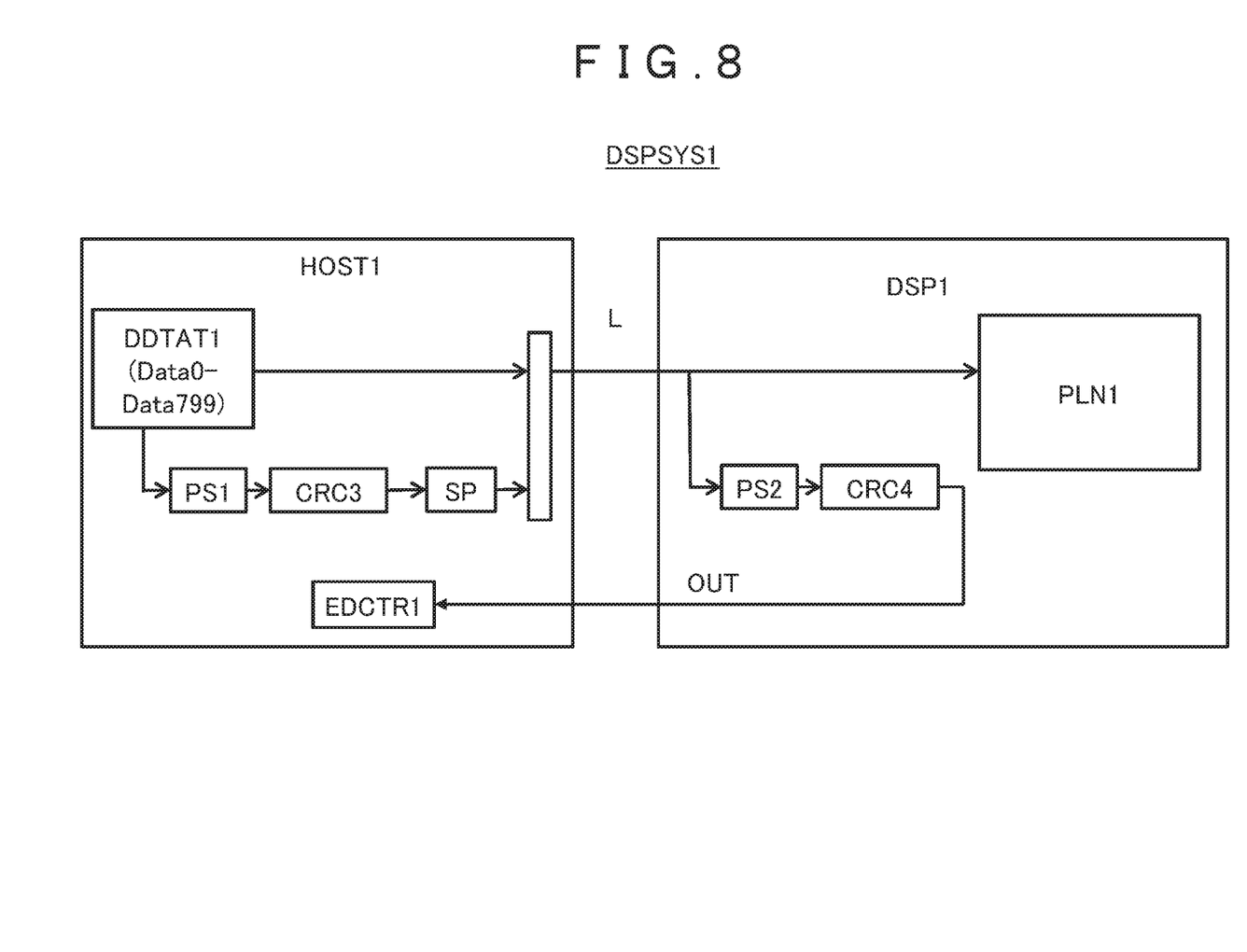
FIG. 8 is a block diagram conceptually illustrating an entire display system according to a comparative example.
Figure 9:
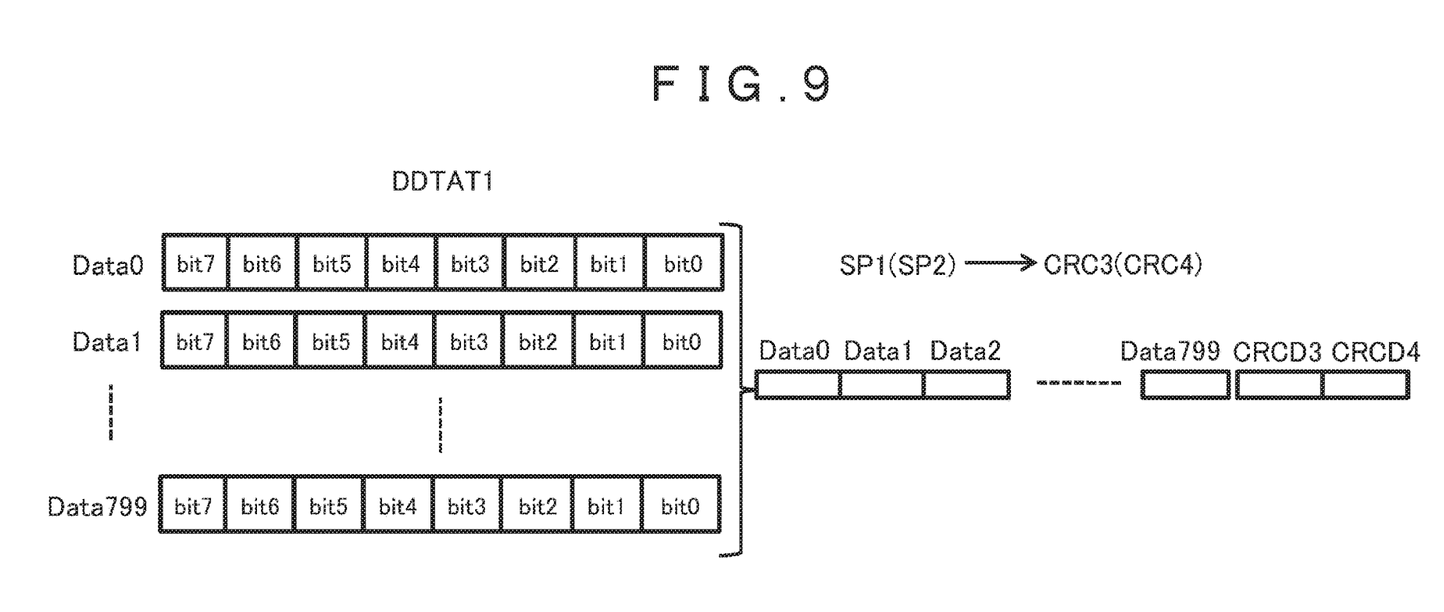
FIG. 9 is a drawing describing a method for generating CRC data in the display system of FIG. 8.

FIG. 8 is a block diagram conceptually illustrating an entire display system according to a comparative example. FIG. 9 is a drawing describing a method for generating CRC data in the display system of FIG. 8.

As illustrated in FIG. 8, a display system DSPSYS1 includes a host device HOST1 and a display DSP1. The host device HOST1 includes display data DDATA1, and the display data DDATA1 includes a plurality of unit display data Data0 to Data799 each composed of, for example, eight bits (bit0 to bit7) similarly to FIG. 6.

The host device HOST1 further includes a parallel-serial conversion circuit PS1, one CRC generation circuit CRC3, and a serial-parallel conversion circuit SP. The parallel-serial conversion circuit PS1 converts the plurality of unit display data Data0 to Data799 from parallel data into serial data. The CRC generation circuit CRC3 sequentially receives the serial data converted by the parallel-serial conversion circuit PS1 to generate CRC data. The serial-parallel conversion circuit SP converts the generated CRC data into parallel data.

Meanwhile, the display DSP1 includes a parallel-serial conversion circuit PS2 and one error detection circuit CRC4. The parallel-serial conversion circuit PS2 converts the plurality of unit display data Data0 to Data799 supplied from the host device HOST1 from the parallel data into serial data. The error detection circuit CRC4 sequentially receives the serial data converted by the parallel-serial conversion circuit PS2 to generate CRC data.

As illustrated in FIG. 9, the plurality of unit display data Data0 to Data799 composed of eight bits (bit0 to bit7) are supplied to the parallel-serial conversion circuit PS1 (PS2) and converted from the parallel data into the serial data. The converted serial data is input to the CRC generation circuit CRC3 or the error detection circuit CRC4, and an operation is executed in the CRC generation circuit CRC3 or the error detection circuit CRC4 based on a CRC generator polynomial, thus generating the CRC data CRCD3 and CRCD4. This example illustrates a case where $X^{16}+X^{12}+X^5+1$ is exemplarily used as the CRC generator polynomial. Therefore, two pieces of CRC data (CRCD3 and CRCD4) each composed of eight bits are generated.

In the comparative example of FIG. 8 and FIG. 9, the parallel-serial conversion circuits PS1 and PS2 are necessary to convert the plurality of unit display data Data0 to Data799 into the serial data. Then, there is a limit to perform high-speed processing on the CRC data. For example, in a case of a dot clock of 50 MHz, the CRC generation circuit CRC3 or the error detection circuit CRC4 is required to behave at at least 50 MHz×8 (bit)=400 MHz.

In addition, the parallel processing of the display data in the comparative example increases the number of logic stages, and this is inappropriate for increasing the speed. When a bit error, for example, caused by divisibility with the CRC generator polynomial occurs, the abnormality such as the error on the display data possibly fails to be detected.

Meanwhile, according to the embodiment, the CRC calculations are performed on the respective bits into which the unit display data (Data0 to Data799) are each divided, thus attaching the CRC data (CRCD10 to CRCD17) for respective bits. The CRC calculations are performed on the respective bits into which the unit display data (Data0 to Data799) are each divided, thus generating the CRC data (CRCD20 to CRCD27) for respective bits. That is, the CRC generation circuits CRC0 to CRC7 or the error detection circuits CRC00 to CRC07 are disposed for respective bits, thus ensuring the parallel processing of the calculations of the CRC data for respective bits. This eliminates the need for the parallel-serial conversion circuit.

For example, in the case of the dot clock of 50 MHz, the CRC generation circuits CRC0 to CRC7 or the error detection circuits CRC00 to CRC07 behave at 50 MHz. This eliminates the need for the calculation of the CRC data using a high-speed clock of, for example, 400 MHz.

The CRC data can be calculated with a simple CRC generation circuit.

The bit failure errors can be detected for respective bits in parallel, the occurrence probability of undetectable data error (error caused by divisibility with the generator polynomial) can be lowered.

All display and display system practicable by an appropriate design modification by those skilled in the art based on the display and the display system described above as embodiments of the present invention also are within the scope of the invention to the extent that the spirit of the invention is included.

Various other variations and modifications can be conceived by those skilled in the art within the spirit of the present invention, and it will be understood that all such variations and modifications also fall within the scope of the invention. For example, addition, deletion, or change of design of the component, or addition, omission, or change of condition of the process, made by those skilled in the art as necessary on the above-described embodiments, are encompassed by the scope of the invention, as long as they fall within the spirit of the invention.

Furthermore, regarding the present embodiments, any advantage and effect those will be obvious from the description in this description or appropriately conceived by those skilled in the art are naturally considered achievable by the present invention.

Appropriately combining a plurality of components disclosed in the above-described embodiment achieves various inventions. For example, some components may be removed from the entire components described in the embodiment. Furthermore, components over different embodiments may be appropriately combined.

What is claimed is:

1. A display comprising:
a display area;
a control unit that receives whole display data to control the display area, the whole display data including a plurality of unit display data and a plurality of cyclic redundancy check (CRC) data, the plurality of unit display data being each composed of a predetermined count of bits, a count of the plurality of CRC data being identical to the predetermined count of bits; and
a plurality of first CRC circuits corresponding to the respective plurality of CRC data.

2. The display according to claim 1,
wherein the plurality of first CRC circuits correspond to respective identical polynomials.

3. The display according to claim 1,
wherein the plurality of first CRC circuits correspond to respective different polynomials.

4. The display according to claim 1,
wherein determination results of the plurality of first CRC circuits are transmitted to a host device.

5. A display system comprising:
the display according to claim 1; and
a host device,
wherein the host device includes:
the plurality of unit display data; and
a plurality of second cyclic redundancy check (CRC) circuits corresponding to the predetermined count of bits, and
the plurality of second CRC circuits each generate CRC data for respective identical bits of the plurality of unit display data.

6. The display system according to claim 5,
wherein the host device attaches the plurality of CRC data to the plurality of unit display data to transmit to the display.

7. The display system according to claim 6,
wherein the display transmits determination results of the plurality of first CRC circuits to the host device.

8. A display comprising:
a display area;
a control unit that receives whole display data to control the display area, the whole display data including a plurality of second cyclic redundancy check (CRC) data as CRC data attached to respective data of bits identical to bits of a plurality of unit display data, the plurality of unit display data being composed of a predetermined count of bits; and a plurality of first CRC circuits corresponding to the respective bits of the plurality of unit display data, wherein the plurality of first CRC circuits each perform a parallel operation on the bit of the plurality of unit display data to generate a plurality of first CRC data, the plurality of first CRC circuits compare the plurality of the first CRC data with the plurality of second CRC data to determine whether an error has occurred.

9. The display according to claim 8,
wherein the plurality of first CRC circuits correspond to respective identical polynomials.

10. The display according to claim 8,
wherein the plurality of first CRC circuits correspond to respective different polynomials.

11. The display according to claim 8,
wherein determination results of the plurality of first CRC circuits are transmitted to a host device.

12. A display system comprising:
the display according to claim 8; and
a host device,
wherein the host device includes:
    the plurality of unit display data; and
    a plurality of second cyclic redundancy check (CRC) circuits corresponding to the predetermined count of bits, and
the plurality of second CRC circuits each perform a parallel operation on identical bits of the plurality of unit display data to generate the plurality of second CRC data.

13. The display system according to claim 12,
wherein the host device attaches the plurality of second CRC data to the plurality of unit display data to transmit to the display.

14. The display system according to claim 13,
wherein the display transmits determination results of the plurality of first CRC circuits to the host device.

* * * * *